United States Patent
Muthukumar et al.

(10) Patent No.: US 7,882,628 B2
(45) Date of Patent: *Feb. 8, 2011

(54) MULTI-CHIP PACKAGING USING AN INTERPOSER SUCH AS A SILICON BASED INTERPOSER WITH THROUGH-SILICON-VIAS

(75) Inventors: Sriram Muthukumar, Chandler, AZ (US); Raul Mancera, Chandler, AZ (US); Yoshihiro Tomita, Ibaraki (JP); Chi-won Hwang, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 429 days.

This patent is subject to a terminal disclaimer.

(21) Appl. No.: 11/755,733

(22) Filed: May 30, 2007

(65) Prior Publication Data

US 2008/0295329 A1    Dec. 4, 2008

(51) Int. Cl.
*H01K 3/10* (2006.01)
(52) U.S. Cl. .............. 29/852; 29/842; 29/830; 29/854; 29/832; 361/763; 361/306.3; 174/262; 174/264; 438/622
(58) Field of Classification Search ............ 29/846, 29/852, 830, 842, 854, 832; 174/262, 264; 363/763, 306.3; 361/763, 306.3; 438/622, 438/459
See application file for complete search history.

(56) References Cited

U.S. PATENT DOCUMENTS

| | | | | |
|---|---|---|---|---|
| 5,646,067 A | | 7/1997 | Gaul | 438/667 |
| 5,759,737 A | * | 6/1998 | Feilchenfeld et al. | 430/311 |
| 6,498,381 B2 | | 12/2002 | Halahan et al. | 257/476 |
| 6,848,177 B2 | | 2/2005 | Swan et al. | 29/852 |
| 6,908,845 B2 | | 6/2005 | Swan et al. | 438/622 |
| 6,979,644 B2 | | 12/2005 | Omote et al. | 438/667 |
| 7,049,208 B2 | | 5/2006 | Muthukumar et al. | 438/459 |
| 7,410,884 B2 | * | 8/2008 | Ramanathan et al. | 438/455 |
| 2003/0047809 A1 | * | 3/2003 | Takeuchi et al. | 257/758 |

(Continued)

OTHER PUBLICATIONS

Newman et al., "Fabrication and Electrical Characterization of 3D Vertical Interconnects", Intel Corporation, 56th Electronic Components & Technology Conference, San Diego, USA, 2006, pp. 394-398.

(Continued)

*Primary Examiner*—Derris H Banks
*Assistant Examiner*—Jeffrey Carley
(74) *Attorney, Agent, or Firm*—Konrad Raynes & Victor LLP; Alan S. Raynes

(57) ABSTRACT

The formation of electronic assemblies is described. One embodiment includes providing a body and forming a first metal pad layer on a first surface thereof. A second metal pad layer is formed in contact with the first metal pad layer, the second metal pad layer having a denser pitch than the first metal pad layer. A dielectric layer is formed between the metal pads in the first and second metal pad layers. Vias extending through the body from a second surface thereof are formed, the vias exposing the first metal pad layer. An insulating layer is formed on via sidewalls and on the second surface, and an electrically conductive layer formed on the insulating layer and on the exposed surface of the first metal layer. Elements are coupled to the second metal pad layer and the electrically conductive layer coupled to a substrate. Other embodiments are described and claimed.

15 Claims, 4 Drawing Sheets

U.S. PATENT DOCUMENTS

| | | | |
|---|---|---|---|
| 2003/0081389 A1 | 5/2003 | Nair et al. | 361/764 |
| 2003/0200654 A1* | 10/2003 | Omote et al. | 29/852 |
| 2004/0229400 A1* | 11/2004 | Chua et al. | 438/108 |
| 2007/0029106 A1* | 2/2007 | Kato | 174/255 |
| 2007/0117348 A1* | 5/2007 | Ramanathan et al. | 438/455 |
| 2008/0295325 A1* | 12/2008 | Muthukumar et al. | 29/830 |

OTHER PUBLICATIONS

Andry et al., "A CMOS-compatible Process for Fabricating Electrical Through-vias in Silicon", IBM Corporation, 56$^{th}$ Electronic Components & Technology Conference, San Diego, USA, 2006, pp. 831-837.

* cited by examiner

MULTI-CHIP PACKAGING USING AN INTERPOSER SUCH AS A SILICON BASED INTERPOSER WITH THROUGH-SILICON-VIAS

BACKGROUND

As performance increases and electronic device sizes decrease, problems relating to the connections between a die and substrate have developed. For example, such problems may relate to the scaling of interconnects on the die and on the substrate, and to meeting performance requirements for power delivery and memory input/output bandwidth.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic device assemblies and methods for their manufacture. Embodiments may include the use of an interposer between multiple die structures and a substrate.

Figure 1:
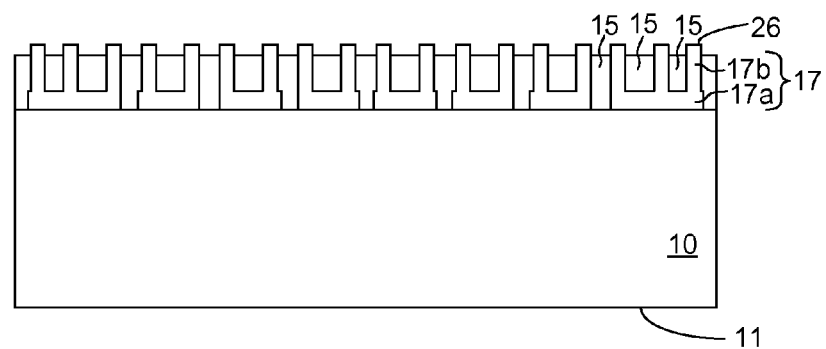
FIG. 1 illustrates a body having electrically conducting and dielectric layers thereon, in accordance with certain embodiments.

FIG. 1 illustrates an embodiment including a body 10 such as an interposer formed from a material including, but not limited to, a semiconductor such as silicon. The body 10 may be an individual interposer or a wafer that will be formed into individual interposers during subsequent processing operations. FIG. 1 also illustrates the formation of an electrically conductive layer 17 and a dielectric layer 15 on the upper surface of the body 10. As used herein, terms such as upper and lower are used in connection with the orientation of the elements as shown in the Figures. The electrically conductive layer 17 and dielectric material 15 may be formed using any suitable CMOS processing methods. Examples of electrically conductive layer 17 materials include, but are not limited to, metals such as copper, tungsten (W), silver (Ag), and gold. The term metal as used herein includes pure metals and alloys. The dielectric material 15 may be formed from electrically insulating materials including, but not limited to, oxides and polymers.

The electrically conductive layer 17 may be formed using a build-up of layers that define multiple paths to another electrically conductive material extending into the vias to be formed during later processing operations. For example, as illustrated in FIG. 1, a first portion of the electrically conductive layer 17 may be a first metal pad layer 17a formed on the surface of the body 10 at a first pitch, and a second portion of the electrically conductive layer 17 may be a second metal pad layer 17b formed on the first metal pad layer, the second pad layer having a denser pitch than the first metal pad layer. The second pad layer portion 17b of electrically conductive layer 17 includes upper portions that may act as interconnection contacts 26 to be used for coupling to other elements. The interconnection pitch of the contacts 26 may be controlled to equal the interconnection pitch on an element to which it will be connected, even if the element has a denser pitch than that of the vertical interconnects through the vias to be formed at a position below the first metal pad layer, as illustrated, for example, in FIG. 5. While first and second pad layers 17a and 17b are illustrated and described above, it is of course understood that additional pad layers may be present.

Figure 2:
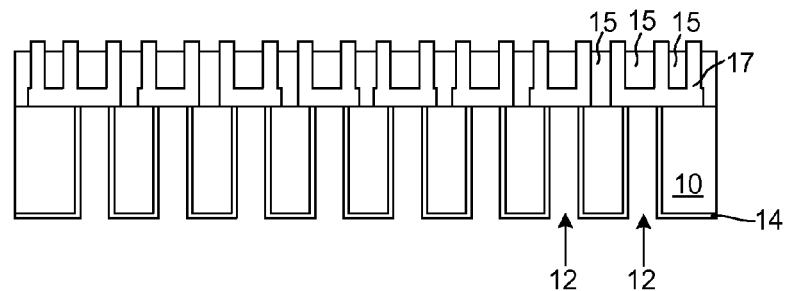
FIG. 2 illustrates the thinning of a body and the formation of vias therethrough, in accordance with certain embodiments.

FIG. 2 illustrates the body 10 after being thinned from the lower surface 11. The thinning may be carried out using any suitable method, for example, chemical mechanical polishing (CMP). A plurality of vias 12 are then formed to extend through the body 10. The vias 12 may be formed using any suitable method, for example, deep reactive ion etching (DRIE). A typical DRIE rate is about 5 microns per minute. In certain embodiments, the body 10 may have a thickness of up to about 200-300 microns after thinning and the vias 12 may be formed to a depth of up to about 200-300 microns and a diameter of about 20-90 microns. Depending on the form factor requirements of the final device, after processing, the body 10 may in certain embodiments be formed into an interposer having a silicon thickness in the range of about 50-300 microns. Embodiments may also have different dimensions and geometries.

When the body 10 is formed from silicon, an electrically insulating layer 14, such as an oxide layer, may be formed on the surfaces defining the vias 12 and on the lower surface of the body 10. The electrically insulating layer 14 may be formed using any suitable method, for example, oxidation. The electrically insulating layer 14 will be coated with an electrically conductive material. The electrically conductive material extending vertically through the vias will act as a vertical interconnection through the interposer body 10. In certain embodiments the vertical interconnections through the vias are formed at the same interconnection pitch as is used on the substrate to which the silicon body will be attached (e.g., as an interposer between functional die structures and the substrate).

Figure 3:
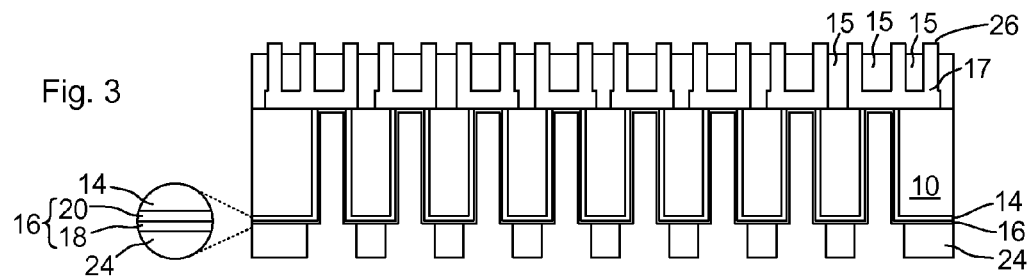
FIG. 3 illustrates the formation of layers on a body within vias, in accordance with certain embodiments.
Figure 4:
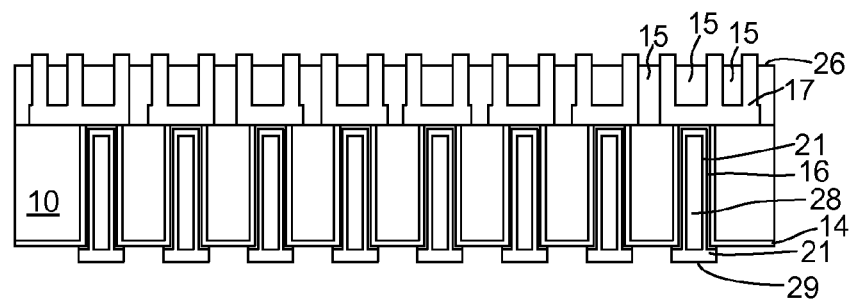
FIG. 4 illustrates forming a material on a body within the vias and extending outward therefrom, in accordance with certain embodiments.

A layer 16 may be formed on the electrically insulating layer 14. The layer 16 may be formed from one or more layers such as an interfacial layer 18 and seed layer 20, as illustrated in the blown up portion of FIG. 3. The interfacial layer 18 and the seed layer 20 are positioned between the electrically insulating layer 14 and another electrically conductive layer 21, which is illustrated in FIG. 4. Examples of interfacial layer 18 materials include, but are not limited to, tantalum (Ta), titanium (Ti), and titanium nitride (TiN). The interfacial layer 18 may act to promote adhesion of the insulation layer 14 to subsequently deposited materials. Examples of seed layer 20 materials include, but are not limited to, copper (Cu) and gold (Au). Examples of the layer 21 materials include, but are not limited to, metals such as copper, tungsten (W), silver (Ag), and gold. The interfacial and seed layers may be deposited using any suitable method, for example, chemical vapor deposition (CVD) and physical vapor deposition (PVD). The layer 21 may also be deposited using any suitable method, for example, plating. A typical plating rate is about 0.5 microns per minute. A mask layer 24 may be utilized if desired, for example, prior to the formation of the layer 21. Any suitable mask, for example, a photoresist mask, may be used.

FIG. 4 illustrates the formation of the layer 21 in the vias 12. The vias 12 may be partially or completely filled. In the embodiment illustrated in FIG. 4, a gap 28 is formed. The sides of the gap 28 are bounded by the layer 21. The layer 21 may be formed to extend a distance outward from the bottom of the via 12, so that bonding pad region 29 is formed. Portions of the layer 16 between the bonding pad regions 29 may be removed using a suitable process such as etching. The layer 21 may be formed using any suitable technique, for example, plating. A typical plating rate is about 0.5 microns per minute. The thickness of the bonding pad region 29 may in certain embodiments be about 30 microns. Other dimensions are also possible. If the body 10 is in the form of a wafer, it may be diced after formation of the layer 21, into individual interposers. Alternatively, the wafer may be diced at another time during the processing operations.

Figure 5:
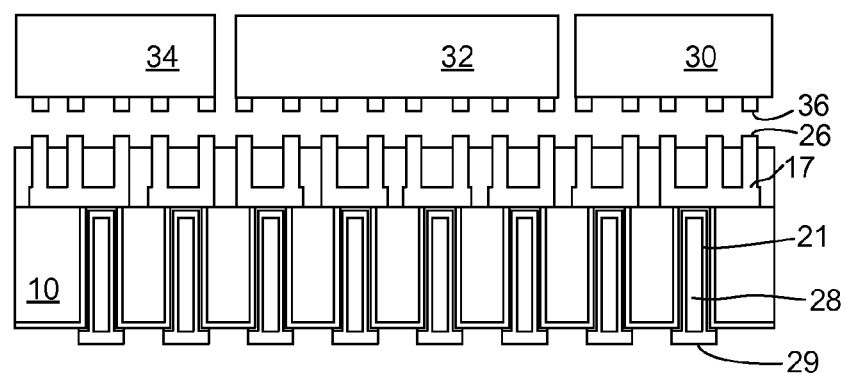
FIG. 5 illustrates positioning a plurality of elements adjacent to a body, in accordance with certain embodiments.

FIG. 5 illustrates the positioning of a plurality of elements such die structures 30, 32, 34 are brought into position adjacent to the interposer body 10. The die structures may be multi-functional die structures including, but not limited to one or more of a central processing unit (CPU), graphical processing unit (GPU), various types of memory, including, but not limited to, dynamic random access memory (DRAM), and voltage regulators. The die structures 30, 32, 34 may in certain embodiments be the same height and may each contain a plurality of interconnection contacts 36, such as C4 interconnections, positioned adjacent to contacts 26 on the interposer body 10. The die structures 30, 32, 34 may be flip-chip mounted to the contacts 26 on the interposer body 10 using a suitable method including, but not limited to, solder reflow or thermo-compression bonding (TCB). Factors which may affect joint function may include pressure, temperature, time, and the materials used.

Figure 6:
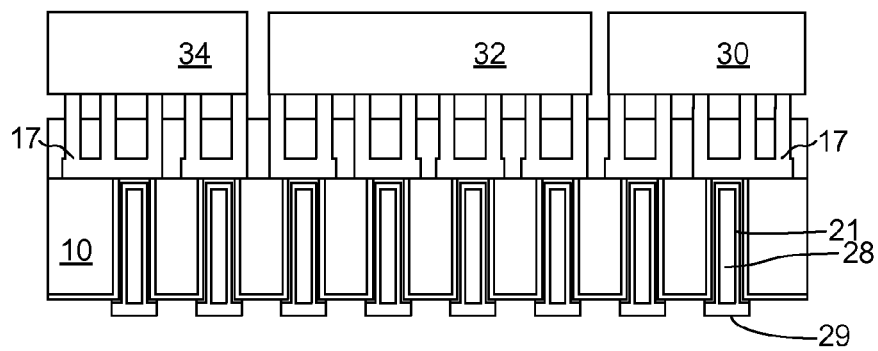
FIG. 6 illustrates coupling a plurality of elements to a body, in accordance with certain embodiments.
Figure 7:
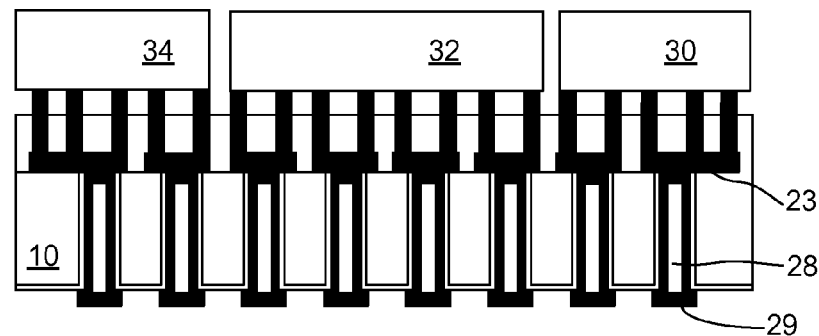
FIG. 7 illustrates the electrical path through a body, in accordance with certain embodiments.

FIG. 6 illustrates the die structures 30, 32, 34 coupled to the body 10 through the contacts 26 at the upper portions of the electrically conductive layer 17. FIG. 7 illustrates the electrical path 23, which is shaded, extending from the die structures 30, 32, 34 through the body 10. As seen in FIG. 7, a single contact at bonding pad region 29 may be electrically connected to a plurality of contacts extending into one of the elements 30, 32, 34.

Figure 8:
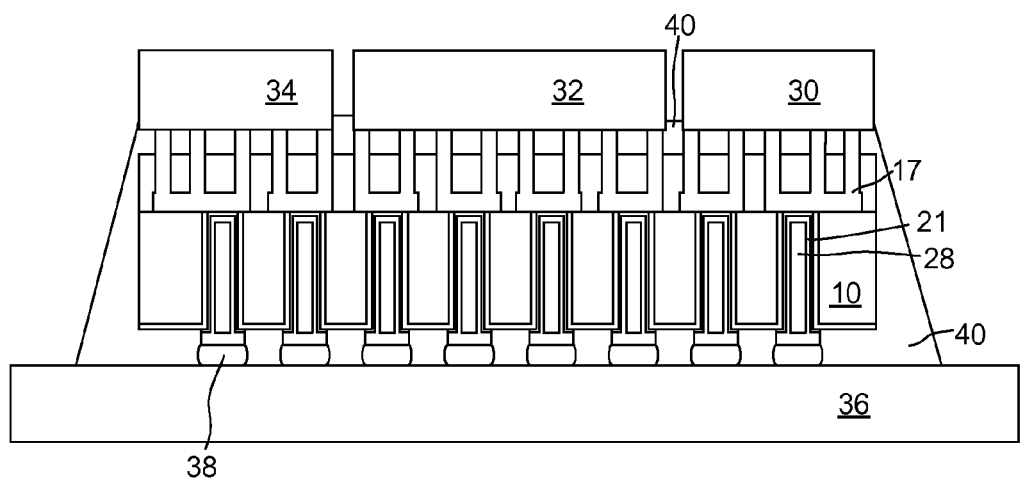
FIG. 8 illustrates attaching a body having the elements coupled thereto to a substrate, in accordance with certain embodiments.

FIG. 8 illustrates the attachment of the body 10 and die structures 30, 32, 34 to a substrate 36. The substrate 36 may in certain embodiments be a package substrate and/or a motherboard having C4 interconnection contacts thereon. The substrate may be formed from materials including, but not limited to, polymer and ceramic materials. A suitable processing technique such as a flip-chip assembly may be used, with the bump bonding connections 38 coupled to the bonding pad region 29 of the layer 21 using a suitable method. A suitable underfill material 40 may be positioned around and between the two-layer stack of the body 10 and the die structures 30, 32, 34 on the substrate 36. An example of a suitable underfill material 40 is a polymer epoxy. The underfill material 40 may be dispensed using a suitable method including, but not limited to, capillary dispense, lamination, spin dispense, and jet dispense.

Figure 9:
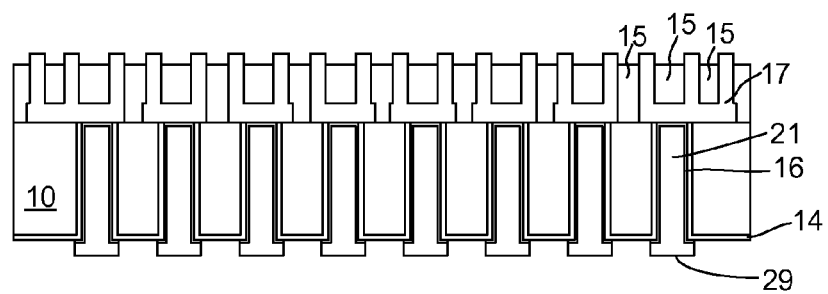
FIG. 9 illustrates a body having a plurality of vias extending therethrough, in which the vias are filled and no gap is present, in accordance with certain embodiments.

FIG. 9 illustrates an embodiment illustrating an body in which there is no gap in the vias. The layer 21 is formed to fill the via and leave no gap 28, as in the embodiment illustrated in FIG. 4, for example. Depending on issues including, but not necessarily limited to, the material used to fill the vias, the filling technique, the geometry, and the aspect ratio of the vias, embodiments may utilize either a partially filled vias (for example, the sidewalls coated and a central section not filled), or a vias filled as completely as possible.

Figure 10:
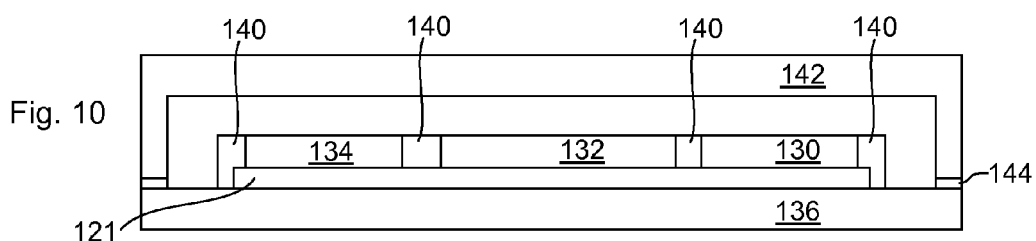
FIG. 10 illustrates an assembly including a plurality of die structures coupled to an interposer body and coupled to a substrate, with a lid also coupled to the substrate, formed in accordance with certain embodiments.

FIG. 10 illustrates an assembly including a plurality of die structures 130, 132, 134 coupled to an interposer 121 which is coupled to a substrate 136, in accordance with an embodiment such as described above. A lid is also coupled to the substrate 136. The lid 144 may act to protect the die structures 130, 132, 134 from damage and may be used for thermal management. An underfill material 140 may be positioned between the substrate 136 and interposer 121 and between the interposer 121 and the die structures 130, 132, 134.

Figure 11:
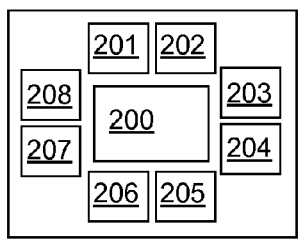
FIGS. 11-13 illustrate views of device layouts such as a CPU surrounded by a plurality of elements, which may be formed in accordance with certain embodiments.
Figure 12:
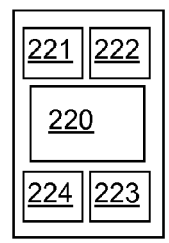
Figure 13:
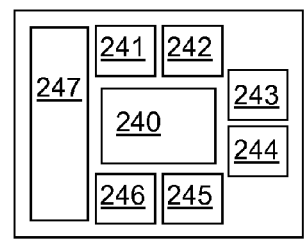

FIGS. 11-13 illustrate views of device layouts including a die structure or element surrounded by a plurality of other die structures or other elements. For example, as illustrated in FIG. 11, the central element 200 may be a central processing unit (CPU) die surrounded by a plurality of memory die elements 201-208. As illustrated in FIG. 12, the device layout includes a central element 220 that may be a CPU, surrounded by a plurality of elements 221-224, which may be DRAM elements. As illustrated in FIG. 13, the device layout includes a central element 240 that may be a CPU, surrounded by a plurality of similar elements 241-246, for example, DRAM elements, and an element 247 that may, for example, be an integrated silicon voltage regulator (ISVR) element. Other types of elements may also be used. The central element surrounded by a plurality of elements may be coupled to an interposer and substrate using processes such as described in embodiments described above. Such a three-dimensional layout using the interposer and multiple die elements coupled thereto may lead to one or more advantages such as fine pitch interconnections and shorter paths for power delivery and for input/output communication between the die elements. It should be appreciated that a large number of other layouts with different elements may also be formed in accordance with certain embodiments.

Assemblies as described in embodiments above may find application in a variety of electronic components. In certain embodiments, a device or devices in accordance with the present description may be embodied in a computer system including a video controller to render information to display on a monitor coupled to the computer. The computer system may comprise one or more of a desktop, workstation, server, mainframe, laptop, handheld computer, handheld gaming device, handheld entertainment device (for example, a video player), PDA (personal digital assistant), telephony device (wireless or wired), etc. Alternatively, a device or devices in accordance with the present description may be embodied in a computing device that does not include a video controller, such as a switch, router, etc.

Figure 14:
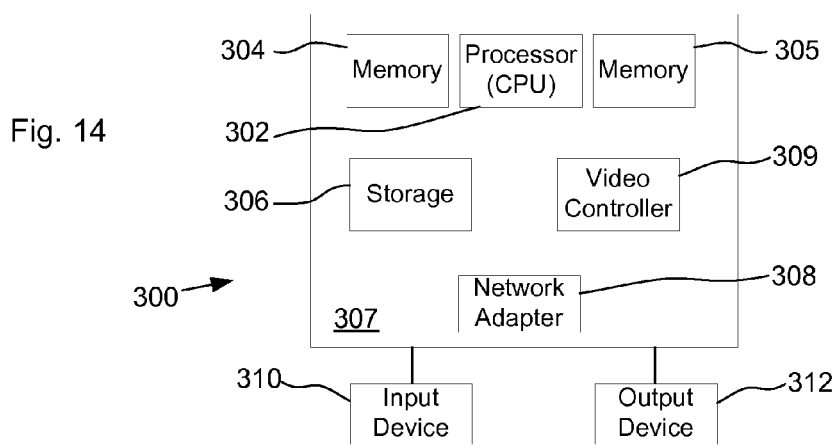
FIG. 14 is an electronic system arrangement in which certain embodiments may find application.

FIG. 14 schematically illustrates one example of an electronic system environment in which aspects of described embodiments may be embodied. Other embodiments need not include all of the features specified in FIG. 14, and may include alternative features not specified in FIG. 14. FIG. 14 illustrates an embodiment of a device including a computer architecture 300 which may utilize integrated circuit devices having a structure including capacitors formed in accordance with embodiments as described above. The architecture 300 may include a CPU 302, memory 303, 304, 305, and storage 306. The CPU 302 may be coupled to a printed circuit board 307, which may be a motherboard. The CPU 302 and the memory 303, 304, 305 is an example of an assembly formed in accordance with the embodiments described above and illustrated in the Figures. One or more of the other components illustrated in FIG. 14 may also be formed as part of the same assembly as the CPU 302 and memory 303, 304, 305. Alternatively, other combinations of the system components may also be formed in accordance with the embodiments described above. The system components may be formed on the motherboard, or may be disposed on other cards such as daughter cards or expansion cards.

The storage 306 may comprise an internal storage device or an attached or network accessible storage. Programs in the storage 306 may be loaded into the memory 303, 304, 305 and be executed by the CPU 302 in a manner known in the art. The architecture may further include a network controller 308 to enable communication with a network, such as an Ethernet, a Fibre Channel Arbitrated Loop, etc. Further, the architecture may, in certain embodiments, also include a video controller 309, to render information on a display monitor, where the video controller may be embodied on a video card or integrated on integrated circuit components mounted on the motherboard, for example. Other controllers may also be present to control other devices.

An input device 310 may be used to provide input to the CPU 302, and may include, for example, a keyboard, mouse, pen-stylus, microphone, touch sensitive display screen, or any other suitable activation or input mechanism. An output device 312 including, for example, a monitor, printer, speaker, etc., capable of rendering information transmitted from the CPU 302 or other component, may also be present.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
   providing a body and forming a first metal pad layer on a first surface thereof;
   forming a second metal pad layer in contact with the first metal pad layer, wherein the first and second metal pad layers are formed so that the first metal pad layer includes a plurality of spaced apart metal pads and the second metal pad layer includes a plurality of spaced apart metal pads, the second metal pad layer having a denser pitch than the first metal pad layer;
   forming a dielectric layer between the metal pads in the first metal pad layer and between the metal pads in the second metal pad layer;
   after forming the first and second metal pad layers and the dielectric layer, forming a plurality of vias extending through the body from a second surface thereof, the vias extending through a thickness of the body and exposing the first metal pad layer;
   forming an insulating layer on sidewalls of the vias and on the second surface;
   forming an electrically conductive layer on the insulating layer and on the exposed surface of the first metal layer; and
   coupling a plurality of elements to the second metal pad layer and coupling the electrically conductive layer to a substrate, the body being positioned between the elements and the substrate.

2. The method of claim 1, wherein the body comprises silicon, wherein the elements comprise silicon die structures, and wherein the elements are flip-chip coupled to the second metal pad layer on the body.

3. The method of claim 1, further comprising forming at least one of an interfacial layer and a seed layer between the insulating layer and the electrically conductive layer.

4. The method of claim 1, wherein an interfacial layer is formed directly on the insulating layer, a metal seed layer is formed directly on the interfacial layer, and the electrically conductive layer is formed directly on the metal seed layer using a plating method.

5. The method of claim 1, wherein the body comprises a wafer, wherein after forming the first and second metal pad layers and the dielectric layer, and prior to forming the plurality of vias extending through the body from a second surface thereof, thinning the wafer, and after the thinning the wafer, dicing the wafer into a plurality of interposers.

6. The method of claim 1, further comprising coupling a lid to the substrate after coupling the electrically conductive layer to the substrate, wherein the lid is positioned to cover the elements.

7. The method of claim 1, wherein the elements include at least one of a central processing unit, a plurality of memory elements, and an integrated silicon voltage regulator.

8. The method of claim 1, wherein the elements include a central processing unit and a plurality of memory elements.

9. A method comprising:
   providing a body and forming a first metal pad layer on a first surface thereof;
   forming a second metal pad layer in contact with the first metal pad layer, wherein the first and second metal pad layers are formed so that the first metal pad layer includes a plurality of spaced apart metal pads and the second metal pad layer includes a plurality of spaced apart metal pads, the second metal pad layer having a denser pitch than the first metal pad layer;
   forming a dielectric layer between the metal pads in the first metal pad layer and between the metal pads in the second metal pad layer;
   after forming the first and second metal pad layers and the dielectric layer, thinning the body from a second surface thereof, the second surface opposite the first surface;
   after thinning the body, forming a plurality of vias extending through the body from a second surface thereof, the vias exposing the first metal pad layer;
   forming an insulating layer on sidewalls of the vias and on the second surface;
   forming an electrically conductive layer on the insulating layer and on the exposed surface of the first metal pad layer; and
   coupling a plurality of elements to the second metal pad layer and coupling the electrically conductive layer to a substrate, the body being positioned between the elements and the substrate.

10. The method of claim 9, wherein the body comprises silicon, the elements comprise silicon die structures, and wherein the elements are flip-chip coupled to the second metal pad layer on the body.

11. The method of claim 9, further comprising forming at least one of an interfacial layer and a seed layer between the insulating layer and the electrically conductive layer.

12. The method of claim 9, wherein a barrier layer is formed directly on the insulating layer, a metal seed layer is formed directly on the interfacial layer, and the electrically conductive layer is formed directly on the seed layer using a plating method.

13. The method of claim 9, wherein the body comprises a wafer, and after thinning the body and after coupling the elements, and before coupling the electrically conductive layer to a substrate, dicing the wafer into individual interposers.

14. The method of claim 9, further comprising coupling a lid to the substrate after the coupling the electrically conductive layer to the substrate, wherein the lid is positioned to cover the elements.

15. The method of claim 9, wherein the elements include at least one of a central processing unit, a plurality of memory elements, and an integrated silicon voltage regulator.

* * * * *